(12) United States Patent
Ryo et al.

(10) Patent No.: US 11,637,033 B2
(45) Date of Patent: *Apr. 25, 2023

(54) METHOD OF MANUFACTURING PROTECTIVE FILM AGENT

(71) Applicant: DISCO CORPORATION, Tokyo (JP)

(72) Inventors: Senichi Ryo, Tokyo (JP); Yukinobu Ohura, Tokyo (JP); Hiroto Yoshida, Tokyo (JP); Tomoaki Endo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,570

(22) Filed: Jan. 14, 2022

(65) Prior Publication Data

US 2022/0139754 A1    May 5, 2022

Related U.S. Application Data

(62) Division of application No. 16/744,823, filed on Jan. 16, 2020, now Pat. No. 11,322,383.

(30) Foreign Application Priority Data

Jan. 18, 2019    (JP) .............................. JP2019-007322

(51) Int. Cl.
| | | |
|---|---|---|
| *H01L 21/683* | (2006.01) | |
| *H01L 23/544* | (2006.01) | |
| *H01L 21/268* | (2006.01) | |
| *H01L 21/78* | (2006.01) | |
| *B23K 26/00* | (2014.01) | |
| *B23K 26/402* | (2014.01) | |
| *H01L 21/02* | (2006.01) | |
| *B23K 103/00* | (2006.01) | |

(52) U.S. Cl.
CPC ........ *H01L 21/6836* (2013.01); *B23K 26/009* (2013.01); *B23K 26/402* (2013.01); *H01L 21/02076* (2013.01); *H01L 21/268* (2013.01); *H01L 21/78* (2013.01); *H01L 23/544* (2013.01); *B23K 2103/56* (2018.08); *H01L 2221/68327* (2013.01); *H01L 2223/5446* (2013.01)

(58) Field of Classification Search
None
See application file for complete search history.

(56) References Cited

U.S. PATENT DOCUMENTS

| | | | | |
|---|---|---|---|---|
| 2002/0197555 | A1* | 12/2002 | Rahman | B01J 20/28028 430/311 |
| 2006/0078821 | A1* | 4/2006 | Shimizu | G03F 7/0045 430/270.1 |
| 2006/0105544 | A1* | 5/2006 | Takanashi | H01L 21/67092 438/460 |

(Continued)

FOREIGN PATENT DOCUMENTS

JP    2006140311 A    6/2006

*Primary Examiner* — Khaja Ahmad
(74) *Attorney, Agent, or Firm* — Greer Burns & Crain, Ltd.

(57) ABSTRACT

A manufacturing method of a protective film agent for laser dicing that includes a solution preparation step of preparing a solution in which at least a water-soluble resin, an organic solvent, and an ultraviolet absorber are mixed; and an ion-exchange treatment step of carrying out ion exchange of sodium ions in the solution by using a cation-exchange resin.

1 Claim, 8 Drawing Sheets

(56) References Cited

U.S. PATENT DOCUMENTS

2007/0248913 A1* 10/2007 Rahman ................ G03F 7/0392
430/311
2009/0291282 A1* 11/2009 Kitamura ............. C08K 5/0016
428/220
2017/0306112 A1* 10/2017 Takafuji ................... C08K 5/19

* cited by examiner

S10

METHOD OF MANUFACTURING PROTECTIVE FILM AGENT

This application is a divisional of application Ser. No. 16/744,823, filed Jan. 16, 2020.

BACKGROUND OF THE INVENTION

Field of the Invention

The present invention relates to a protective film agent for laser dicing applied to a workpiece in the case of processing the workpiece by irradiation with a laser beam, a manufacturing method of a protective film agent for laser dicing, and a method for processing a workpiece using a protective film agent for laser dicing.

Description of the Related Art

Device chips including devices such as electronic circuits are mounted on pieces of electronic equipment typified by mobile phones and personal computers. For example, the device chips are manufactured by dividing a workpiece including a semiconductor material such as silicon into plural regions along planned dividing lines. For example, the workpiece is divided by carrying out ablation processing of the workpiece by a laser beam with such a wavelength as to be absorbed by the workpiece. However, at the time of the ablation processing, a melt of the workpiece becomes debris and is scattered to adhere to the front surface of the workpiece, so that the quality of the device chips after the dividing often lowers. Therefore, a technique is known in which debris is prevented from directly adhering to the front surface of a workpiece by forming a protective film including a water-soluble resin, an ultraviolet absorber, and so forth on the front surface of the workpiece before ablation processing is carried out for the workpiece (for example, refer to Japanese Patent Laid-open No. 2006-140311).

Making the protective film contain the ultraviolet absorber have plural advantages. First, when the front surface side of a workpiece on which the protective film is formed is irradiated with a laser beam having a wavelength in the ultraviolet band, the ultraviolet absorber absorbs the laser beam and the protective film is subjected to ablation processing earlier than the workpiece. Due to this, film separation of the protective film occurs less readily compared with the case in which the workpiece is subjected to the ablation processing through absorption of the laser beam earlier than the protective film. Secondly, it can be checked whether or not the protective film is formed on the front surface of the workpiece by utilizing property that the ultraviolet absorber absorbs ultraviolet rays and emits light (fluorescence). In addition, whether or not the protective film is evenly formed on the front surface of the workpiece can be evaluated based on the distribution status of the light emitting region.

SUMMARY OF THE INVENTION

Incidentally, when a protective film agent containing the ultraviolet absorber is stored in a tank or the like for a long period, functions of the ultraviolet absorber, such as absorption characteristics of ultraviolet rays and luminescence characteristics, lower over time. For example, functions of the ultraviolet absorber lower in a comparatively-short period under light exposure conditions, high-temperature conditions, or alkaline conditions. As a result, there are problems that film separation of the protective film occurs more readily at the time of ablation processing and it becomes difficult to check whether or not the protective film exists by using fluorescence and to evaluate whether or not the protective film is evenly formed. The present invention is made in view of such problems and intends to provide a protective film agent for laser dicing with which functions of the protective film agent containing an ultraviolet absorber lower less readily over time compared with protective film agents of the related art.

In accordance with an aspect of the present invention, there is provided a protective film agent for laser dicing including a solution in which at least a water-soluble resin, an organic solvent, and an ultraviolet absorber are mixed. Content of Na of the solution is equal to or lower than 100 ppb in weight ratio.

Preferably, the solution further includes an antioxidant.

Furthermore, preferably the antioxidant is one of or both an ascorbic acid and an ascorbic acid derivative.

Moreover, preferably, the solution includes the antioxidant whose content is lower than 0.05 wt %.

In accordance with another aspect of the present invention, there is provided a manufacturing method of a protective film agent for laser dicing. The manufacturing method includes a solution preparation step of preparing a solution in which at least a water-soluble resin, an organic solvent, and an ultraviolet absorber are mixed and an ion-exchange treatment step of carrying out ion exchange of Na ions in the solution by using a cation-exchange resin.

In accordance with another aspect of the present invention, there is provided a processing method of a workpiece using a protective film agent for laser dicing. The processing method includes a protective film forming step of forming a protective film through applying the protective film agent for laser dicing that includes a solution in which at least a water-soluble resin, an organic solvent, and an ultraviolet absorber are mixed and in which content of Na of the solution is equal to or lower than 100 ppb in weight ratio on a front surface side of the workpiece having, on the front surface side thereof, a device region in which a device is disposed in each of a plurality of regions marked out by a plurality of planned dividing lines that intersect and a peripheral surplus region that surrounds the device region. The processing method includes also a laser processing step of irradiating the front surface side of the workpiece after the protective film forming step with a laser beam with such a wavelength as to be absorbed by the workpiece and processing the workpiece along the plurality of planned dividing lines and a cleaning step of cleaning the front surface side of the workpiece after the laser processing step.

The protective film agent for laser dicing according to the one aspect of the present invention includes the solution in which at least the water-soluble resin, the organic solvent, and the ultraviolet absorber are mixed and the content of sodium (Na) of this solution is equal to or lower than 100 ppb in weight ratio. As above, by sufficiently decreasing the content of Na, the protective film agent for laser dicing can be implemented in which functions of the ultraviolet absorber such as absorption characteristics of ultraviolet rays and luminescence characteristics lower less readily.

The above and other objects, features and advantages of the present invention and the manner of realizing them will become more apparent, and the invention itself will best be understood from a study of the following description and

DETAILED DESCRIPTION OF THE PREFERRED EMBODIMENT

Figure 1:
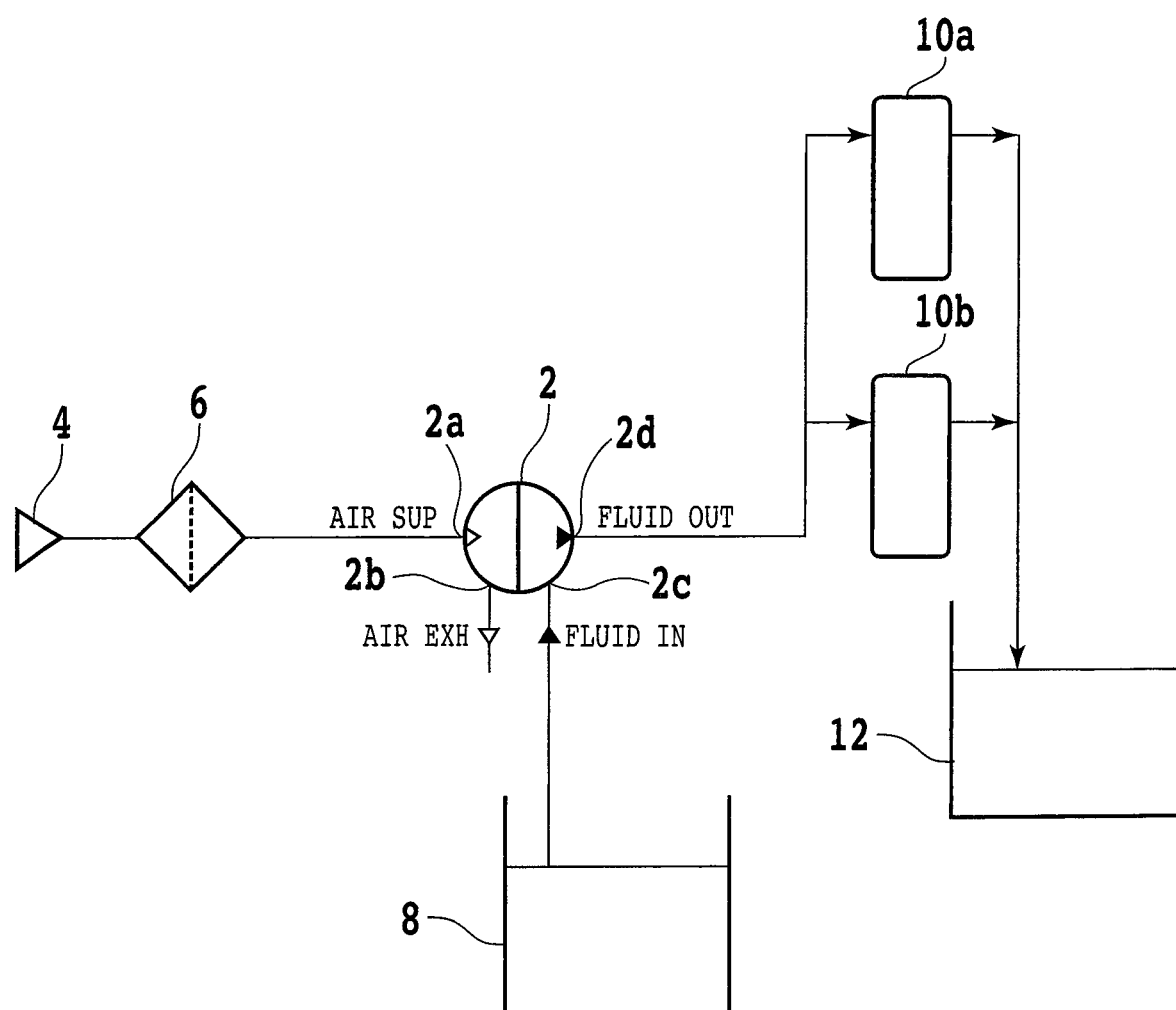
FIG. 1 is an outline diagram of an ion-exchange system.

An embodiment according to one aspect of the present invention will be described with reference to the accompanying drawings. First, a protective film agent for laser dicing (hereinafter referred to simply as protective film agent) will be described. The protective film agent includes a solution in which at least a water-soluble resin, an organic solvent, and an ultraviolet absorber are mixed. The content of sodium (Na) in the solution is suppressed to be equal to or lower than 100 parts per billion (ppb) in weight ratio (i.e., $100\times10^{-7}$ wt %). By setting the content of Na in the protective film agent to 100 ppb or lower, discoloration of the protective film agent can be suppressed.

The water-soluble resin is polyvinylpyrrolidone, polyvinyl alcohol, polyethylene glycol, polyethylene oxide, methyl cellulose, ethyl cellulose, hydroxypropyl cellulose, polyacrylic acid, poly-N-vinylacetamide, or polyglycerin, for example. Furthermore, one kind of material in the above-described materials may be used alone or a material obtained by combining two or more kinds of the materials may be used.

The organic solvent is an organic compound for dissolving substances such as the ultraviolet absorber. The organic solvent is alkylene glycol monoalkyl ether, alkylene glycol, or alkylene glycol monoalkyl ether acetate, for example. As one example of alkylene glycol monoalkyl ether, propylene glycol monomethyl ether is cited.

The ultraviolet absorber is a cinnamic acid derivative, for example. As one example of the cinnamic acid derivative, ferulic acid (i.e., 4-hydroxy-3-methoxycinnamic acid) is cited. The cinnamic acid derivative may be isoferulic acid, caffeic acid, sinapinic acid, or chlorogenic acid.

The present applicant has found that, when the protective film agent discolors over time, functions of the ultraviolet absorber, such as absorption characteristics of ultraviolet rays and luminescence characteristics, lower. Against this, the present applicant has further found that the discoloration of the protective film agent can be suppressed by setting the content of Na in the protective film agent to 100 ppb or lower. One of the reasons for the discoloration of the protective film agent will be because the structure of the ultraviolet absorber changes. For example, in the case of using the ferulic acid as the ultraviolet absorber, the ferulic acid of monomers captures Na and changes to dimers possibly but the ratio of the number of monomers of the ferulic acid that change to dimers to the total number of monomers of the ferulic acid can be reduced by setting the content of Na in the protective film agent to 100 ppb or lower.

The respective monomers of isoferulic acid and caffeic acid also capture Na and change to dimers similarly. Therefore, the ratio of monomers that change to dimers can be reduced by decreasing the content of Na in the protective film agent. Also regarding sinapinic acid and chlorogenic acid, it is inferred that the ratio of monomers that change to dimers can be reduced similarly by decreasing the content of Na in the protective film agent. As above, when the ultraviolet absorber changes to the form of dimers, the light absorption characteristics of the protective film agent will change and the protective film agent will discolor. Furthermore, the ultraviolet absorber will exert the absorption function of ultraviolet rays, the luminescence function, and so forth in the form of monomers. However, when the ultraviolet absorber changes to the form of dimers, functions such as the absorption characteristics of ultraviolet rays and the luminescence characteristics will lower.

The solution of the protective film agent may further contain an antioxidant. Although details are unclear, by adding an appropriate amount (for example, larger than 0 wt % and smaller than 0.05 wt %) of antioxidant to the protective film agent, the structure change of the compound that functions as the ultraviolet absorber can be suppressed compared with the case of adding the antioxidant whose content exceeds 0.05 wt %. That is, the stability in the monomers of the ultraviolet absorber is improved. Therefore, the discoloration of the protective film agent can be suppressed. The antioxidant is one of or both ascorbic acid and ascorbic acid derivative. As the antioxidant, L-ascorbic acid (i.e., vitamin C), D-araboascorbic acid, ethyl ascorbic acid, and ascorbic acid 2-glucoside may be each used alone or any two or more kinds of the materials may be used in combination.

Next, a manufacturing method of the protective film agent will be described. First, a first solution obtained by dissolving a solid water-soluble resin in purified water and a second solution obtained by dissolving a solid ultraviolet absorber in an organic solvent are prepared. Subsequently, by mixing the first solution and the second solution, a solution in which the water-soluble resin, the organic solvent, and the ultraviolet absorber are mixed is prepared (solution preparation step). An antioxidant may be further mixed into the solution. After the solution preparation step, Na ions in the solution are reduced by treating the solution by using an ion-exchange system 1 (ion-exchange treatment step). A solution (i.e., protective film agent) whose Na content is thereby equal to or lower than 100 ppb in weight ratio is manufactured.

The ion-exchange system 1 used for the manufacturing of the protective film agent will be described. FIG. 1 is a schematic diagram of the ion-exchange system 1. In FIG. 1, part of constituent elements is illustrated in a simplified manner by lines, blocks, symbols, and so forth. The ion-exchange system 1 has a process pump 2 that sucks and discharges a liquid by using air. In the present manufacturing method, an SMC process pump made by SMC Corporation (model PA3410) is used as the process pump 2, for example. Air is supplied from an air supply source 4 to an air supply port 2a of the process pump 2. An air filter 6, a reducing valve (not illustrated), and a three-port electromagnetic valve (not illustrated) are disposed between the air supply source 4 and the air supply port 2a in that order from the side of the air supply source 4, and the air adjusted to a predetermined pressure is supplied to the air supply port 2a. The air after use is exhausted from an air exhaust port 2b to the external through a silencer (not illustrated).

A first tank 8 in which, for example, 400 liters (L) of the solution prepared in the solution preparation step is stored is connected to an intake port 2c of the process pump 2. An intake port of a throttle valve (not illustrated) is connected to a discharge port 2d of the process pump 2. Moreover, two columns (first column 10a and second column 10b) each filled with an ion-exchange resin are connected in parallel to a discharge port of the throttle valve. As each column, a cartridge made by Muromachi Chemicals Inc. (model MR-5) is used, for example.

Furthermore, each column is filled with 4 kg of Muromac (registered trademark in Japan) XSC-1614-H made by Muromachi Chemicals Inc. as the ion-exchange resin, for example. This ion-exchange resin is a cation-exchange resin and has a function of carrying out ion exchange between hydrogen ions and other cations in the protective film agent through discharging of hydrogen ions and capturing of other cations (for example, Na ions, copper (Cu) ions, iron (Fe) ions) by sulfo groups in the resin. The flow rate of the fluid that flows in the throttle valve is set to 2.0 L/min, for example. At this time, the pressure in the throttle valve is 0.39 MPa, for example. The protective film agent subjected to the ion exchange by the first column 10a and the second column 10b is discharged to a second tank 12 at a flow rate of 2.0 L/min, for example.

Next, working example 1 and working example 2 of the present manufacturing method will be described in detail. In the solution preparation step of working example 1 and working example 2, as indicated in Table 1 to be described below, solutions were prepared by using polyvinylpyrrolidone, ferulic acid, propylene glycol monomethyl ether, and water. The solution in working example 1 was made to contain 0.0025 wt % of ascorbic acid as an antioxidant, whereas the solution in working example 2 was not made to contain the ascorbic acid. Furthermore, as comparative example 1, the solution with the same conditions as working example 2 was prepared. Moreover, the solutions in working example 1 and working example 2 were treated by using the above-described ion-exchange system 1 (ion-exchange treatment step). Protective film agents whose Na content was reduced were thereby manufactured. In comparative example 1, the solution whose Na content was not reduced was dealt with as the protective film agent.

Thereafter, the Na content of each of the protective film agents in working example 1 and working example 2 after the ion-exchange treatment and the protective film agent in comparative example 1 was analyzed by using Agilent 7700x ICP-MS, which was an inductively coupled plasma-mass spectrometer (ICP-MS) made by Agilent Technologies, Inc. As indicated in Table 1, the Na content of the protective film agents in working example 1 and working example 2 after the ion-exchange treatment was 45 ppb in weight ratio. In contrast, the Na content of the protective film agent in comparative example 1, for which the ion-exchange treatment had not been performed, was 310 ppb in weight ratio. As above, the Na content of the protective film agents became lower than ⅙ through the ion-exchange treatment. Furthermore, the pH of the protective film agents in working example 1 and working example 2 was 4.1 before the ion-exchange treatment and became 3.2 after the ion-exchange treatment. The Cu content and the Fe content did not greatly change through the ion-exchange treatment and therefore description thereof is omitted in Table 1.

TABLE 1

|  | Working example 1 | Working example 2 | Comparative example 1 |
| --- | --- | --- | --- |
| Polyvinylpyrrolidone (water-soluble resin) | 6.40 wt % | 6.40 wt % | 6.40 wt % |
| Ferulic acid (ultraviolet absorber) | 0.30 wt % | 0.30 wt % | 0.30 wt % |
| Propylene glycol monomethyl ether (organic solvent) | 14.00 wt % | 14.00 wt % | 14.00 wt % |
| Ascorbic acid (antioxidant) | 0.0025 wt % | Not contained | Not contained |
| Water | All the rest | All the rest | All the rest |
| Total | 100.00 wt % | 100.00 wt % | 100.00 wt % |
| Ion-exchange treatment | Performed | Performed | Not performed |
| Na content of protective film agent | 45 ppb | 45 ppb | 310 ppb |

Next, an accelerated test was carried out by using the protective film agents in working example 1 and working example 2 after the ion-exchange treatment and the protective film agent in comparative example 1, for which the ion-exchange treatment had not been performed. In consideration of the fact that functions of the ultraviolet absorber lower readily under a high-temperature condition particularly, each protective film agent was stored in a tank made of polyethylene (so-called plastic container) in an environment that was at 40° C. and was shielded from light and thereafter the absorbance of each protective film agent was measured. For the measurement of the absorbance, an ultraviolet and visible spectrophotometer (UV-2700 made by Shimadzu Corporation) was used. In the measurement of the absorbance, the measurement target sample was enclosed in a cell made of quartz. Then, light in a predetermined wavelength band was made incident from one side surface of the cell and light that had been transmitted through the measurement target sample and gone out from another side surface located on the opposite side to the one side surface was detected by a detector. The optical path length of the cell was set to 1 cm.

Figure 2A:
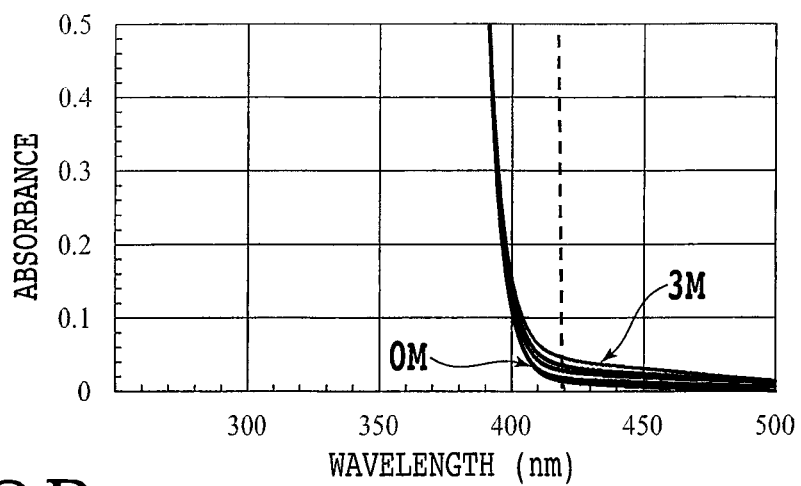
FIG. 2A is an absorption spectrum of a protective film agent in working example 1.
Figure 2B:
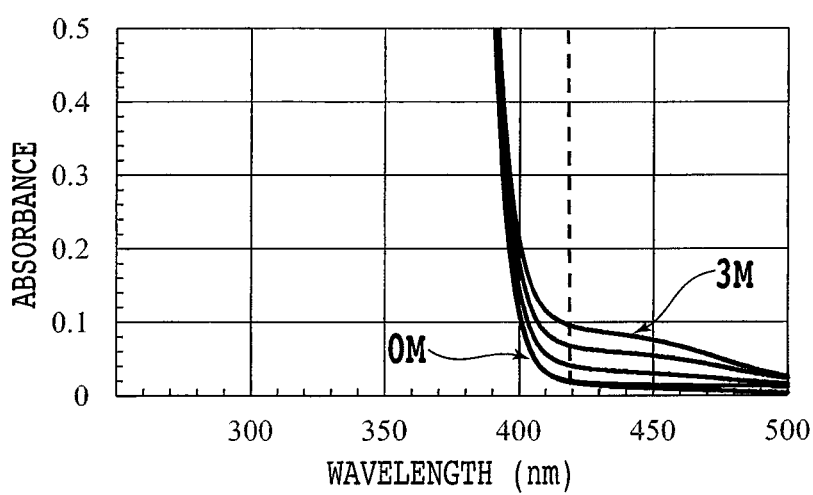
FIG. 2B is an absorption spectrum of a protective film agent in working example 2.
Figure 2C:
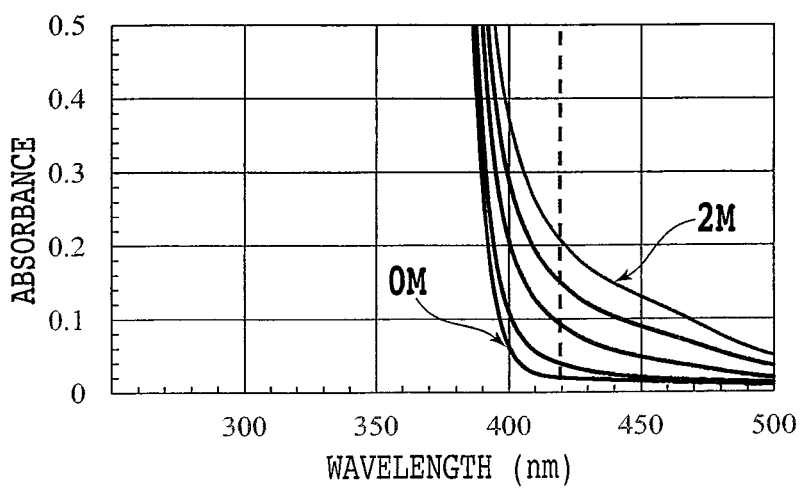
FIG. 2C is an absorption spectrum of a protective film agent in comparative example 1.

FIG. 2A is an absorption spectrum of the protective film agent in working example 1. FIG. 2B is an absorption spectrum of the protective film agent in working example 2. FIG. 2C is an absorption spectrum of the protective film agent in comparative example 1. The abscissa axes of FIG. 2A, FIG. 2B, and FIG. 2C represent the wavelength (nm) and the ordinate axes represent the absorbance (dimensionless quantity). Incidentally, dashed lines indicate a wavelength 420 nm. In FIG. 2A, FIG. 2B, and FIG. 2C, the curves located on the lowermost side represent the absorbance after 0 M (zero months), i.e., at the timing of test start). In FIG. 2A and FIG. 2B, the absorbance near the wavelength 420 nm (dashed line) rose as the time elapsed to 0.5 M, 1 M, and 2 M. Then, after 3 M (at the timing of elapse of three months), the absorbance slightly rose as indicated by the curves located on the uppermost side.

Figure 3:
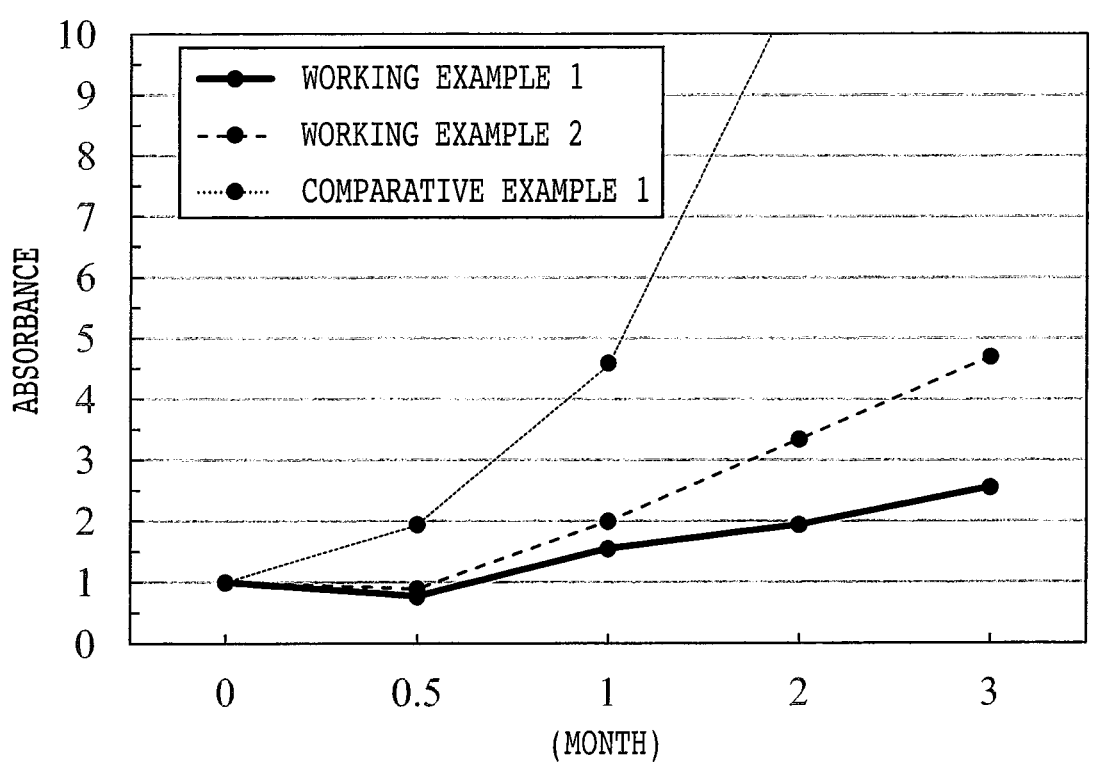
FIG. 3 is a first experimental result obtained by measuring time change in the absorbance at a wavelength 420 nm.

In contrast, in FIG. 2C, the absorbance suddenly rose as the time elapsed to 0.5 M, 1 M, and 1.5 M and, after 2 M (at the timing of elapse of two months), the absorbance greatly rose as indicated by the curve located on the uppermost side. When the absorbance of the protective film agent at the wavelength 420 nm rises, the protective film agent discolors to yellow, for example. This means that functions of the ultraviolet absorber have lowered. Therefore, change in the absorbance of the protective film agent at the wavelength 420 nm was measured. FIG. 3 is a first experimental result obtained by measuring time change in the absorbance at the wavelength 420 nm. The abscissa axis represents the time (months) and the ordinate axis represents the absorbance (dimensionless quantity).

In working example 1 and working example 2, the absorbance was suppressed to be low compared with comparative example 1 even at the timing of elapse of three months. In contrast, in comparative example 1, the absorbance began to rise after the test start and the protective film agent discolored in a short period compared with working example 1 and working example 2. The Na content in working example 1 and working example 2 was 45 ppb in weight ratio. In comprehensive view of the experiments made thus far, the present applicant infers that, when the Na content of the protective film agent is set to 100 ppb or lower in weight ratio and preferably to 50 ppb or lower, the Na content is lower than in comparative example 1 and the discoloration of the protective film agent can be suppressed similarly to working example 1 and working example 2. If the discoloration can be suppressed, functions of the ultraviolet absorber lower less readily over time.

As indicated in FIG. 3, with the protective film agent in working example 1 containing the antioxidant, the absorbance was suppressed compared with the protective film agent in working example 2, which did not contain the antioxidant. Therefore, a second experiment of investigating change in the absorbance attributed to the content of the antioxidant was carried out. In the second experiment, the ascorbic acid was used as the antioxidant. Furthermore, eight different samples of conditions A to H were prepared.

As indicated in Table 2 in detail, in the protective film agent of condition A, the concentration of the ascorbic acid was set to the maximum concentration in conditions A to H. The concentration of the ascorbic acid in the protective film agent was gradually decreased in order of conditions B, C, D, E, and F. The ascorbic acid was not added to the protective film agents of conditions G and H. Ion-exchange treatment was performed for the protective film agents of conditions A to G by using the above-described ion-exchange system 1. In contrast, the ion-exchange treatment was not performed for the protective film agent of condition H.

Figure 4:
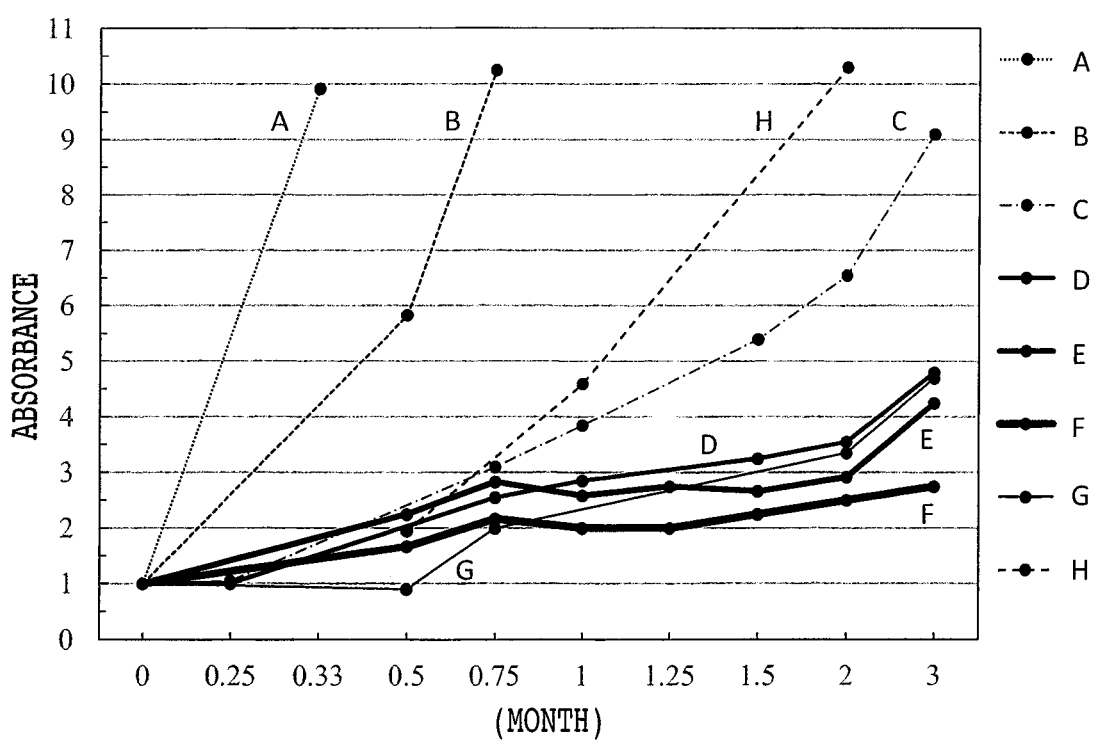
FIG. 4 is a second experimental result obtained by measuring time change in the absorbance at the wavelength 420 nm.

FIG. 4 represents a second experimental result obtained by measuring time change in the absorbance at the wavelength 420 nm. In the protective film agents of conditions A and B, the absorbance drastically rose in a shorter period than the protective film agent of condition H, for which the ion-exchange treatment had not been performed. Furthermore, in the protective film agent of condition C, the absorbance suddenly rose at the time of elapse of three months although being lower than the protective film agents of conditions A, B, and H. In contrast, in the protective film agents of conditions D, E, F, and G, in which the content of the ascorbic acid was set lower than 0.050 wt %, the absorbance at the time of elapse of three months could be suppressed to substantially half or lower compared with the protective film agent of condition C.

Although the detailed mechanism is unclear, the discoloration of the protective film agent was suppressed by performing the ion-exchange treatment (i.e., setting the Na content to 100 ppb or lower in weight ratio) and setting the content of the ascorbic acid of the protective film agent lower than 0.050 wt %. That is, functions of the ultraviolet absorber came to lower less readily over time compared with the protective film agent of the related art. With the protective film agent of condition D, in which the content of the ascorbic acid of the protective film agent was 0.025 wt %, at the time of elapse of three months, the suppression effect of the absorbance at a level equivalent to that of the protective film agent of condition G, which did not contain the antioxidant, was obtained. Furthermore, with the protective film agent of condition E, in which the content of the ascorbic acid was set to 0.010 wt %, the absorbance could be suppressed than the protective film agent of condition G at the time of elapse of three months.

Moreover, with the protective film agent of condition F, in which the content of the ascorbic acid was set to 0.003 wt %, the absorbance could be suppressed than the protective film agent of condition E at the time of elapse of three months. Therefore, it is preferable to set the content of the ascorbic acid of the protective film agent to 0.025 wt % or lower. Furthermore, it is more preferable to set the content to 0.010 wt % or lower and it is further preferable to set the content to 0.003 wt % or lower. It is inferred that the same effect as the case in which the ascorbic acid whose content is lower than 0.050 wt % is added to the protective film agent occurs also in the case in which an ascorbic acid derivative

TABLE 2

| | A | B | C | D | E | F | G | H |
|---|---|---|---|---|---|---|---|---|
| Polyvinyl-pyrrolidone (water-soluble resin) | 6.34 wt % | 6.39 wt % | 6.39 wt % | 6.40 wt % | 6.40 wt % | 6.40 wt % | 6.40 wt % | 6.40 wt % |
| Ferulic acid | 0.30 wt % | 0.30 wt % | 0.30 wt % | 0.30 wt % | 0.30 wt % | 0.30 wt % | 0.30 wt % | 0.30 wt % |
| Propylene glycol monomethyl ether (organic solvent) | 13.86 wt % | 13.99 wt % | 13.99 wt % | 14.00 wt % | 14.00 wt % | 14.00 wt % | 14.00 wt % | 14.00 wt % |
| Ascorbic acid (antioxidant) | 1.000 wt % | 0.100 wt % | 0.050 wt % | 0.025 wt % | 0.010 wt % | 0.003 wt % | Not contained | Not contained |
| Water | All the rest | All the rest | All the rest | All the rest | All the rest | All the rest | All the rest | All the rest |
| Total | 100.00 wt % | 100.00 wt % | 100.00 wt % | 100.00 wt % | 100.00 wt % | 100.00 wt % | 100.00 wt % | 100.00 wt % |
| Ion-exchange treatment | Performed | Performed | Performed | Performed | Performed | Performed | Performed | Not performed | whose content is lower than 0.050 wt % is added to the protective film agent. Moreover, it is inferred that the same effect occurs also in the case in which the ascorbic acid and an ascorbic acid derivative are added to the protective film agent in such a manner that the content is lower than 0.050 wt % in total.

Figure 5A:
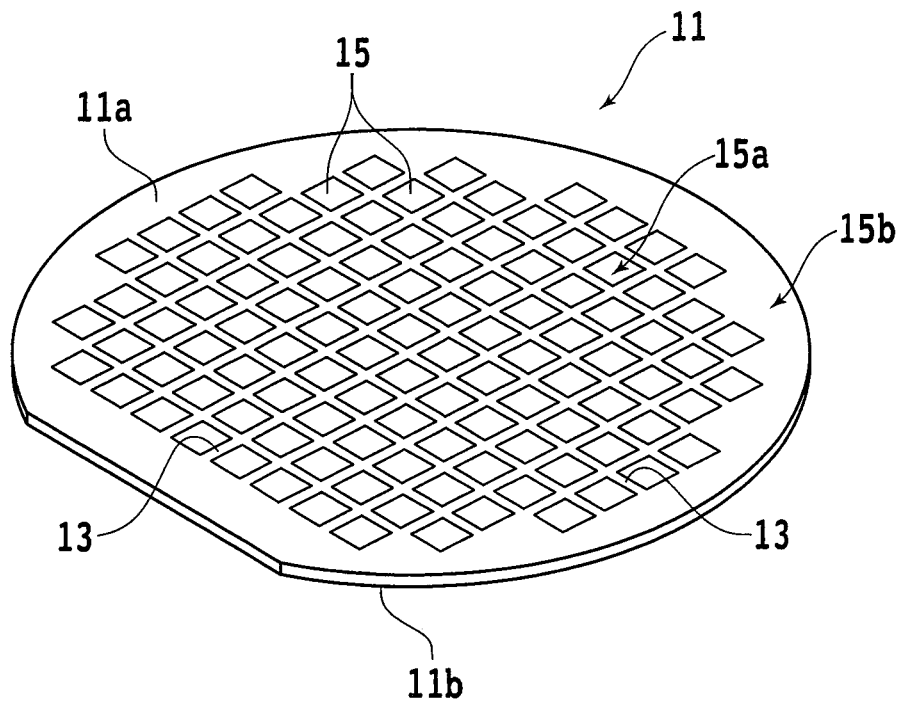
FIG. 5A is a perspective view of a workpiece.

Next, a processing method of a workpiece 11 using the protective film agent will be described. First, the shape of the workpiece 11 will be described. FIG. 5A is a perspective view of the workpiece 11. The workpiece 11 has a substantially circular disc shape. The side of a front surface 11a of the workpiece 11 is segmented by plural planned dividing lines (streets) 13 that intersect to be orthogonal to each other and a device 15 such as an integrated circuit (IC) and a large-scale integration (LSI) is made in each region arising from this segmentation.

A device region 15a in which the plural devices 15 are made is formed on the side of the front surface 11a of the workpiece 11. There is no limit to the kind, quantity, shape, structure, size, arrangement, and so forth of the devices 15. Furthermore, on the side of the front surface 11a of the workpiece 11, a peripheral surplus region 15b is disposed to surround the device region 15a. An orientation flat that indicates the crystal orientation is made at part of the peripheral surplus region 15b.

Figure 5B:
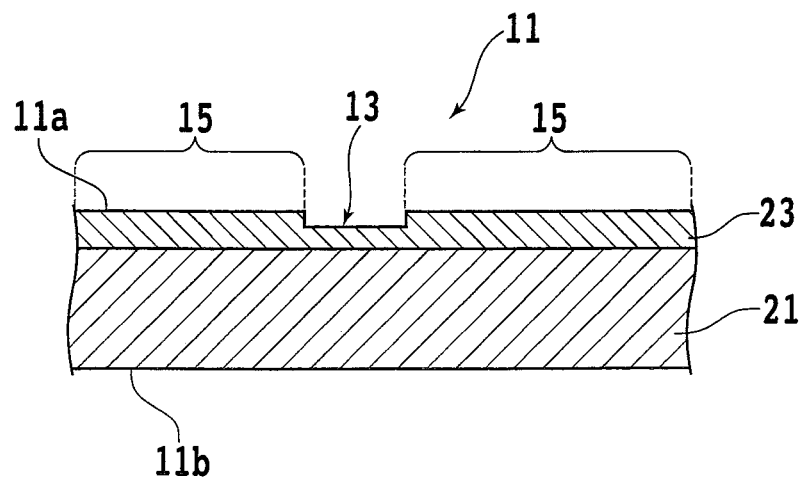
FIG. 5B is a sectional view in which part of the workpiece is enlarged.

FIG. 5B is a sectional view in which part of the workpiece 11 is enlarged. The workpiece 11 has a wafer 21 formed mainly of silicon (Si). There is no limit to the material of the wafer 21 and it is also possible to use semiconductor materials other than silicon, such as gallium arsenide (GaAs) and silicon carbide (SiC), for example. A functional region (not illustrated) that is part of a functional element is formed on one surface side of the wafer 21 and a stacked-layer body 23 is disposed on this functional region. The stacked-layer body 23 includes a low-dielectric-constant insulator films (so-called Low-k films) (not illustrated) and a wiring layer (not illustrated) that are alternately stacked, the wiring layer including metal wiring layers, vias and so forth.

Figure 6:
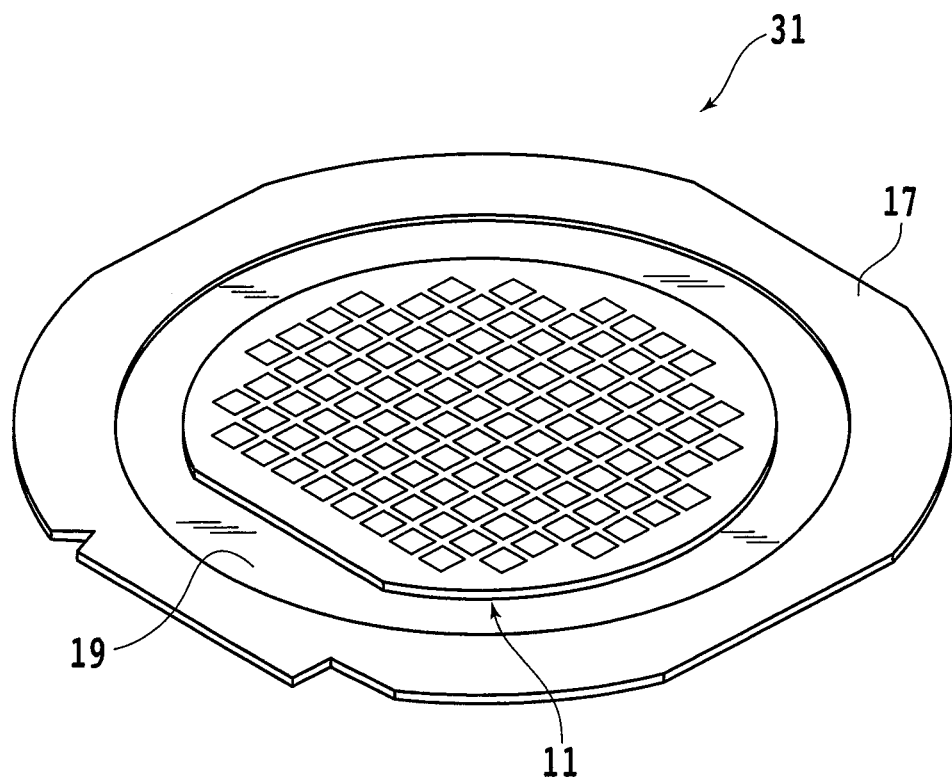
FIG. 6 is a perspective view of a frame unit.

The stacked-layer body 23 and the functional region of the wafer 21 configure the functional element and the above-described devices 15 are configured by plural functional elements. As illustrated in FIG. 5B, the parts of the devices 15 in the stacked-layer body 23 are protruding parts that protrude upward relative to the parts of the planned dividing lines 13. The other surface of the wafer 21 located on the opposite side to the one surface of the wafer 21 is a back surface 11b of the workpiece 11 exposed to the outside. Next, a processing method of processing the workpiece 11 by a laser beam will be described. First, a frame unit 31 is formed (frame unit forming step (S10)). FIG. 6 is a perspective view of the frame unit 31.

The frame unit 31 has a ring-shaped frame 17 made of a metal. The ring-shaped frame 17 has an opening with a diameter larger than the workpiece 11. The workpiece 11 is disposed inside the opening of the ring-shaped frame 17 and is integrated with the ring-shaped frame 17 with the intermediary of a dicing tape 19. The dicing tape 19 is a stacked-layer body including a base layer and an adhesion layer, for example. For example, the base layer has a thickness of 5 μm to 200 μm inclusive and includes a resin such as polyolefin (PO), polyethylene terephthalate (PET), polyvinyl chloride (PVC), or polystyrene (PS). Furthermore, the adhesion layer includes an ultraviolet-curable resin, for example.

In frame unit forming step (S10), a tape mounter (not illustrated) is used, for example. The tape mounter has a chuck table (not illustrated) and a porous plate (not illustrated) with a circular disc shape is disposed on an upper surface side of this chuck table. The porous plate includes a porous member and is connected to a suction source (not illustrated) such as an ejector through a flow path (not illustrated) formed inside the chuck table. When the suction source is actuated, a negative pressure is generated for a front surface of the porous plate. The front surface of the porous plate functions as a holding surface that sucks and holds the side of the front surface 11a of the workpiece 11 and one surface of the ring-shaped frame 17.

A sticking apparatus (not illustrated) is disposed above the chuck table. The sticking apparatus sticks part of the strip-shaped dicing tape 19 wound into a roll shape to the workpiece 11 and the ring-shaped frame 17. Furthermore, a cutter (not illustrated) or the like that cuts the stuck dicing tape 19 into a circular shape with a predetermined diameter is disposed above the chuck table. In the frame unit forming step (S10), first, the ring-shaped frame 17 is placed on the holding surface. Subsequently, the workpiece 11 is placed in the opening of the ring-shaped frame 17 in such a manner that the front surface 11a of the workpiece 11 faces the holding surface. Then, the suction source is actuated to suck and hold the ring-shaped frame 17 and the workpiece 11 by the chuck table. A protective member that is a circular sheet made of a resin may be disposed between the front surface 11a of the workpiece 11 and the holding surface.

Figure 7A:
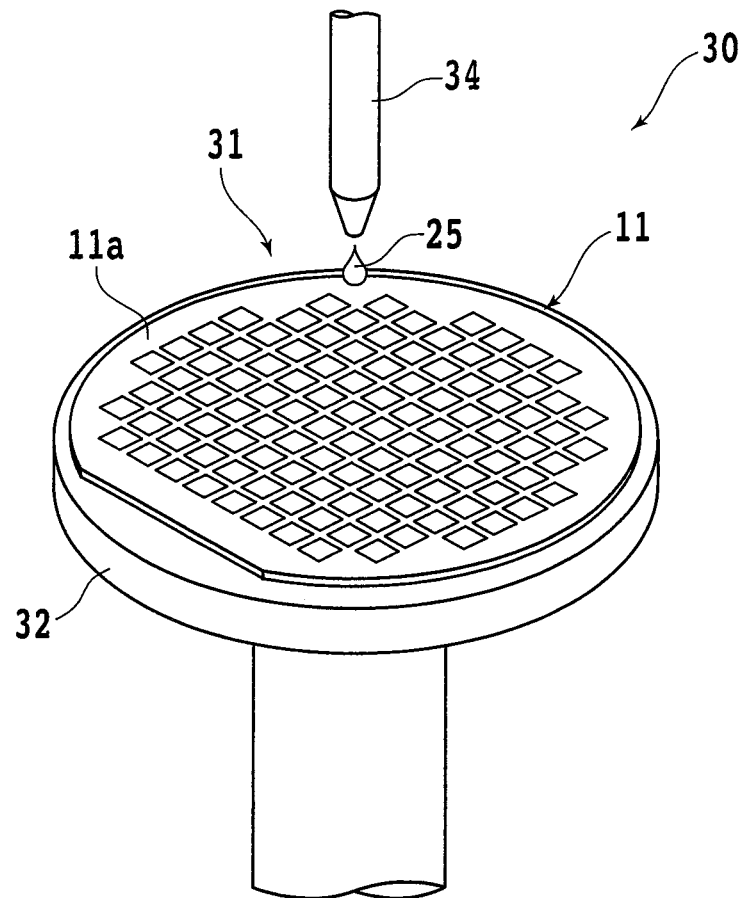
FIG. 7A is a diagram illustrating a protective film forming step.

In this state, the adhesion layer side of the dicing tape 19 is stuck to a first surface of the ring-shaped frame 17 and the side of the back surface 11b of the workpiece 11. Thereafter, the dicing tape 19 is cut into a circular shape by the above-described cutter to have a diameter that is larger than the opening of the ring-shaped frame 17 and is smaller than an outer circumference of the ring-shaped frame 17. The frame unit 13 is thereby formed. After the frame unit forming step (S10), on the side of the front surface 11a of the workpiece 11, a liquid-state protective film agent 25 described in the above-described working example 1 and so forth is applied and a protective film 27 is formed (protective film forming step (S20)). FIG. 7A is a diagram illustrating the protective film forming step (S20). In FIG. 7A, the ring-shaped frame 17 and the dicing tape 19 are omitted.

In the protective film forming step (S20), a protective film forming apparatus 30 is used, for example. The protective film forming apparatus 30 has a chuck table 32 that sucks and holds the side of the back surface 11b of the workpiece 11 with the intermediary of the dicing tape 19. The chuck table 32 is connected to a rotational drive source (not illustrated) such as a motor and rotates, with a straight line substantially parallel to the vertical direction being the rotation axis. A porous plate (not illustrated) with a circular disc shape is disposed on an upper surface side of the chuck table 32. The porous plate includes a porous member and is connected to a suction source (not illustrated) such as an ejector similarly to the chuck table of the above-described tape mounter. When the suction source is actuated, a front surface of the porous plate functions as a holding surface that holds the workpiece 11.

Figure 7B:
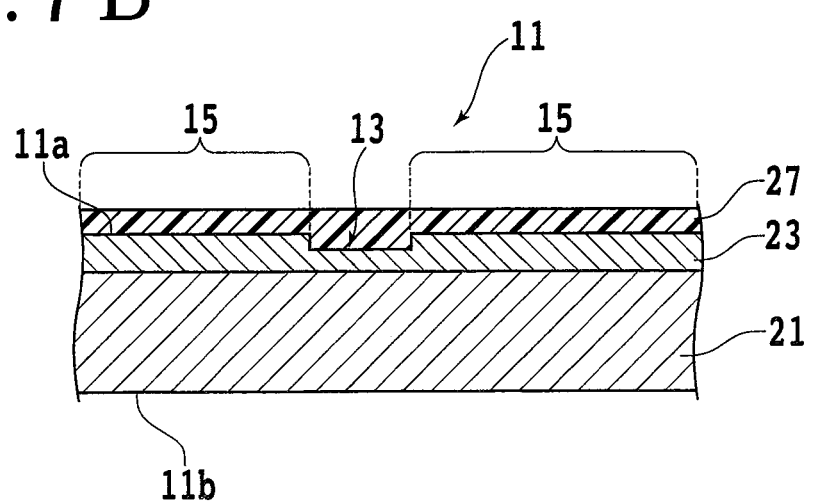
FIG. 7B is a sectional view in which part of the workpiece on which a protective film is formed is enlarged.

A nozzle 34 that sprays the liquid-state protective film agent 25 toward the porous plate is disposed above the chuck table 32. The nozzle 34 is connected to a supply source (not illustrated) of the protective film agent 25 through a flow path that is not illustrated. In the protective film forming step (S20), first, the workpiece 11 is placed on the chuck table 32 in such a manner that the side of the back surface 11b of the workpiece 11 is opposed to the holding surface with the intermediary of the dicing tape 19. Subsequently, the suction source is actuated to suck and hold the side of the back surface 11b by the chuck table 32. Thereafter, the rotational drive source is operated to rotate the chuck table 32. In this state, the liquid-state protective film agent 25 is supplied from the nozzle 34 to the front surface 11a of the workpiece 11. The protective film agent 25 evenly spreads over the front surface 11a due to a centrifugal force. Thereafter, the supply of the protective film agent 25 is stopped and the protective film agent 25 is dried. The protective film 27 is thereby formed on the front surface 11a. FIG. 7B is a sectional view in which part of the workpiece 11 on which the protective film 27 is formed is enlarged.

In FIG. 7B, an upper surface of the protective film 27 (i.e., surface of the protective film 27 located on the opposite side to the front surface 11a of the workpiece 11) is formed to be flat in such a manner that steps of a recessed part between two devices 15 (i.e., planned dividing line 13) are absorbed. However, the protective film 27 may be formed with a constant thickness in such a manner as to follow recesses and protrusions of the front surface 11a. Furthermore, after the protective film 27 is formed, whether or not the protective film 27 is evenly formed on the front surface 11a may be evaluated by utilizing luminescence characteristics of the protective film 27.

The protective film 27 is a film for preventing debris generated in a laser processing step (S30) to be described later from directly adhering to the front surface 11a of the workpiece 11. In addition, differently from photoresist, the protective film 27 is not developed by a developer after exposure and, after pattern forming, etching is also not performed for the protective film 27 through this pattern. As above, functions and purposes of the protective film 27 are different from photoresist used in a photolithography process. Therefore, in the protective film 27, it is important to set the Na content of the protective film 27 to 100 ppb or lower in weight ratio.

Figure 8:
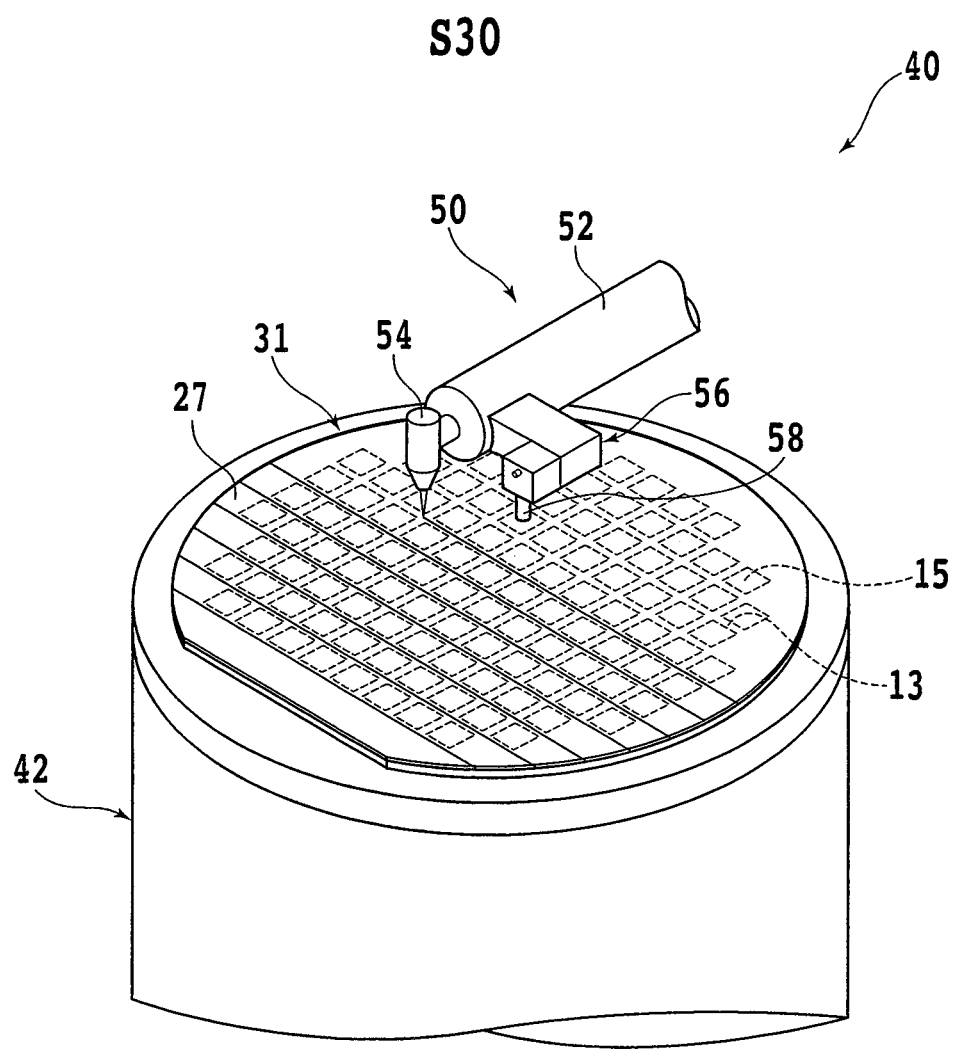
FIG. 8 is a diagram illustrating a laser processing step.

After the protective film forming step (S20), the workpiece 11 is processed by a laser processing apparatus 40 (laser processing step (S30)). FIG. 8 is a diagram illustrating the laser processing step (S30). The laser processing apparatus 40 has a chuck table 42 that sucks and holds the side of the back surface 11b of the workpiece 11. The chuck table 42 has a rotational drive source, a porous plate, a suction source, and so forth similar to those of the chuck table 32 and therefore detailed description thereof is omitted. A drive unit (not illustrated) that rotationally drives the chuck table 42 is disposed below the chuck table 42. Furthermore, below the drive unit, an X-axis movement mechanism (not illustrated) that moves the chuck table 42 along an X-axis direction and a Y-axis movement mechanism (not illustrated) that moves the chuck table 42 along a Y-axis direction are disposed.

A laser beam irradiation unit 50 that carries out irradiation with a pulsed laser beam is disposed above the porous plate (not illustrated) of the chuck table 42. The laser beam irradiation unit 50 carries out irradiation with a laser beam with such a wavelength as to be absorbed by the workpiece 11. If the workpiece 11 is silicon, such a wavelength as to be absorbed by the workpiece 11 is a wavelength in an ultraviolet band (for example, 355 nm). The laser beam irradiation unit 50 has a casing 52 with a substantially cylindrical shape. A laser oscillator (not illustrated) that emits a pulsed laser beam is disposed in the casing 52. The laser oscillator is a YAG laser oscillator or $YVO_4$ laser oscillator, for example.

In the casing 52, a frequency setting unit (not illustrated) that sets a repetition frequency of the laser beam emitted from the laser oscillator is further disposed. The frequency setting unit sets the repetition frequency of the laser beam to a predetermined frequency in a range from 40 kHz to 200 kHz, for example. The laser beam emitted from the laser oscillator is incident on a head part 54 fixed to a tip part of the casing 52 and is emitted from the head part 54 toward the holding surface of the chuck table 42. An imaging unit 56 having a camera part 58 opposed to the holding surface is disposed at a position adjacent to the head part 54. The camera part 58 of the imaging unit 56 has a light source part (not illustrated) that irradiates the workpiece 11 sucked and held by the holding surface with, for example, a visible light beam and an imaging element (not illustrated) that images reflected light from the workpiece 11.

In the laser processing step (S30), first, the workpiece 11 is placed on the chuck table 42 in such a manner that the side of the back surface 11b of the workpiece 11 is opposed to the holding surface with the intermediary of the dicing tape 19. Subsequently, the suction source is actuated to suck and hold the side of the back surface 11b by the chuck table 42. Thereafter, at least one of the planned dividing lines 13 on the side of the front surface 11a of the workpiece 11 is imaged by using the camera part 58. Then, based on the imaging result, the chuck table 42 is rotated by a predetermined angle by the above-described drive unit in such a manner that the planned dividing line 13 becomes parallel to the X-axis direction. Subsequently, while the side of the front surface 11a of the workpiece 11 is irradiated with the laser beam from the head part 54, the head part 54 and the chuck table 42 are relatively moved along the X-axis direction by using the above-described X-axis movement mechanism. The protective film 27 and the workpiece 11 are thereby subjected to ablation processing along the planned dividing line 13 and a dividing groove is formed. The workpiece 11 is cut with this dividing groove being the boundary, for example.

After the dividing grooves are formed along all planned dividing lines 13 along one direction, the chuck table 42 is rotated by 90 degrees and the dividing grooves are formed along all planned dividing lines 13 along another direction orthogonal to the one direction. The workpiece 11 is thereby divided into plural device chips. The protective film 27 according to one aspect of the present invention includes the protective film agent 25 in which the content of Na is equal to or lower than 100 ppb in weight ratio. As above, by sufficiently decreasing the content of Na, the protective film 27 can be implemented in which functions of the ultraviolet absorber such as absorption characteristics of ultraviolet rays and luminescence characteristics lower less readily.

After the laser processing step (S30), the frame unit 31 is conveyed to a cleaning apparatus (not illustrated) by a conveying arm that is not illustrated and the side of the front surfaces of the plural device chips (i.e., corresponding to the front surface 11a of the workpiece 11 after the processing) is cleaned by the cleaning apparatus (cleaning step (S40)). In the cleaning step (S40), cleaning water (for example, purified water) is sprayed onto the workpiece 11 and the protective film 27 is removed together with debris. After the cleaning step (S40), the frame unit 31 is conveyed to a pick-up mechanism (not illustrated) by the conveying arm that is not illustrated and the respective divided device chips are taken out (chip taking-out step (S50)). The pick-up mechanism has an ultraviolet irradiation apparatus and a taking-out apparatus with a pushing-up part and a collet or the like, for example.

In the chip taking-out step (S50), first, the side of the back surface 11b of the frame unit 31 is irradiated with ultraviolet rays by the ultraviolet irradiation apparatus. An adhesion force of the adhesion layer of the dicing tape 19 is thereby lowered. Then, each device chip is pushed up from a lower side by the pushing-up part and an upper surface of the pushed-up device chip is sucked by the collet to convey the device chip. In this manner, all device chips are taken out, so that the processing of the workpiece 11 ends.

The description is made above regarding the manufacturing method of the protective film agent 25, change in the absorbance according to whether or not the ion-exchange treatment is performed (working example 1 and working example 2, comparative example 1, first experimental result), change in the absorbance attributed to the content of the antioxidant (second experimental result), the structure of the workpiece 11, and the processing method of the workpiece 11. Besides, structures, methods, and so forth according to the above-described embodiment can be carried out with appropriate changes without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of a protective film agent for laser dicing, the manufacturing method comprising:
   a solution preparation step of preparing a solution in which at least a water-soluble resin, an organic solvent, and an ultraviolet absorber are mixed; and
   an ion-exchange treatment step of carrying out ion exchange of sodium ions in the solution by using a cation-exchange resin.

* * * * *